US006559818B1

(12) United States Patent
Browning

(10) Patent No.: US 6,559,818 B1
(45) Date of Patent: *May 6, 2003

(54) METHOD OF TESTING ADDRESSABLE EMISSIVE CATHODES

(75) Inventor: Jim Browning, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/017,550

(22) Filed: Feb. 2, 1998

Related U.S. Application Data

(63) Continuation of application No. 08/377,320, filed on Jan. 24, 1995, now abandoned.

(51) Int. Cl.[7] .................................................. G09G 3/10
(52) U.S. Cl. ......................... 345/74.1; 345/75.2; 345/55
(58) Field of Search ............................. 345/74.1, 75.2, 345/55; 315/169.1, 169.2, 169.3, 169.4

(56) References Cited

U.S. PATENT DOCUMENTS

| | | | | |
|---|---|---|---|---|
| 4,763,187 A | * | 8/1988 | Biberian ..................... | 348/796 |
| 5,006,792 A | | 4/1991 | Malhi et al. ................. | 324/762 |
| 5,008,657 A | | 4/1991 | Hanson et al. ............... | 345/74 |
| 5,015,912 A | * | 5/1991 | Spindt et al. ................ | 313/495 |
| 5,099,178 A | * | 3/1992 | Bozzer et al. ............... | 315/169.1 |
| 5,103,144 A | * | 4/1992 | Dunham ..................... | 315/366 |

(List continued on next page.)

FOREIGN PATENT DOCUMENTS

| | | | |
|---|---|---|---|
| WO | WO85/05491 | 5/1985 | |
| WO | 85/05491 | 5/1985 | ............ H01J/31/12 |

OTHER PUBLICATIONS

Busta, H.H., "Vacuum microelectronics—1992", *J. Micromech. Microeng.*, pp. 43–74, (1992).
Schwoebel, et al., "Filed–Emitter Array Performance Enhancement Using Glow Discharge Processing", IVMC Technical Digest, Jul. 12–15, 1993, p. 14.
Sokolich, et al., "A Study of the Emission Characteristics of All–metal Cold Cathodes", IVMC Technical Digest, Jul. 12–15, 1993, pp. 19, 20.
R. Cummins et al., "Evaluating Image Quality and Defect Characterization Flat–Panel", Journal, pp. 29–32.
Francois Henley et al., "A High Speed Plat Panel In–Process Test System for TFT Array Using Electro–Optic Effects", Journal, pp. 64–67.
Glenn D. Houser, "In–Process Testing of LCD Panels by Voltage Imaging TM: Methods and Capabilities", Journal.
Brochure, "FIS Flat Panel Inspection System", Photon Dynamics.
Heinz H. Busta, "Vacuum microelectronics—1992", Journal, pp. 43–74.
M. Miller et al., "A Flat–Panel–In–Process Test System Using Voltage Imaging", Journal, pp. 27–31.
J. R. Monkowski et al., "Detection and Measurement of Low Contrast Mura Defects in Flat–Panel Displays", Journal, pp. 51–52.
Busta, H.H., "Vacuum microelectronics—1992", *J. Micromech. Microeng.*, pp. 43–74, (1992).

*Primary Examiner*—William A. Cuchlinski, Jr.
*Assistant Examiner*—Marthe Marc-Coleman
(74) *Attorney, Agent, or Firm*—Schwegman, Lundberg, Woessner & Kluth, P.A.

(57) ABSTRACT

A method for determining functionality of pixels comprising the addressing of at least one but not more than ten pixels at a time, thereby producing a current. The pixels are comprised of cathode emitters. The current is collected on an anode disposed opposite the pixels, and the current is measured.

28 Claims, 3 Drawing Sheets

U.S. PATENT DOCUMENTS

| | | | |
|---|---|---|---|
| 5,155,413 A | * 10/1992 | Bozzer et al. | 315/169.1 |
| 5,194,780 A | 3/1993 | Meyer | 315/169.3 |
| 5,262,698 A | 11/1993 | Dunham | 315/169.1 |
| 5,283,500 A | 2/1994 | Kochanski | 315/169.3 |
| 5,300,862 A | 4/1994 | Parker et al. | 315/169.1 |
| 5,336,992 A | 8/1994 | Saito et al. | 324/754 |
| 5,382,961 A | 1/1995 | Gale, Jr. | 345/904 |
| 5,432,461 A | 7/1995 | Henley | 345/904 |
| 5,459,409 A | * 10/1995 | Henley | 324/770 |
| 5,459,410 A | 10/1995 | Henley | 345/904 |
| 5,459,480 A | 10/1995 | Browning et al. | 345/75 |
| 5,475,281 A | 12/1995 | Heijboer | 313/337 |
| 5,475,317 A | 12/1995 | Smith | 324/760 |
| 5,491,427 A | 2/1996 | Ueno et al. | 324/754 |
| 5,493,236 A | 2/1996 | Ishii et al. | 324/752 |
| 5,541,478 A | 7/1996 | Troxell et al. | 345/75 |
| 5,542,866 A | * 8/1996 | Tsai | 445/2 |
| 5,638,086 A | 6/1997 | Lee et al. | 345/74 |
| 5,721,472 A | * 2/1998 | Browing et al. | 315/169.1 |
| 5,730,634 A | 3/1998 | Seko | 445/3 |
| 5,751,262 A | 5/1998 | Browning et al. | 345/75 |
| 5,942,849 A | * 8/1999 | Cade | 313/495 |
| 6,064,217 A | 5/2000 | Smith | 324/760 |

* cited by examiner

METHOD OF TESTING ADDRESSABLE EMISSIVE CATHODES

This application is a continuation of U.S. patent application Ser. No. 08/377,320, filed Jan. 24, 1995 now abandoned.

This invention was made with Government support under Contract No. DABT63-94-C-0012 awarded by the Advanced Research Projects Agency (ARPA). The Government has certain rights in the invention.

GOVERNMENT RIGHTS

This invention was made with United States Government support under contract No. DABT63-94-C-0012 awarded by the Advanced Research Projects Agency (ARPA). The United States Government has certain rights in this invention.

FIELD OF THE INVENTION

This invention relates to matrix addressable display devices, and more particularly to a method for testing the emission of the displays.

BACKGROUND OF THE INVENTION

Quality assurance requires the testing of manufactured products to determine if they will function over a given set of parameters. Testing is performed on a random sampling of products from the production lines, or in some industries, on every product which is manufactured.

Optical measurements are currently performed on display devices at the final stages of display testing. Optical measurement is accomplished by turning on all the cathode emitters in a pixel, and visually observing them. This method is extremely subjective, as it relies on the judgement of the individual peering at the screen.

Photon Dynamics of Milipitas, Calif. employs a method in which photons from a full display (i.e., substantially all of the pixels are turned "on" at the same time) are measured. A completed display device is optically tested by measuring the light emitted from the display.

There are several drawbacks to the above described optical method. For example, the process is very expensive, as it requires sophisticated optics and processing algorithms in order to determine the relative number of functional pixels.

Additionally, the optical systems require closely spaced anodes with respect to the cathode in order for the inspection optics to obtain accurate measurements. Therefore, the optical systems are not practical for testing display base-plates prior to their assembly in a field emission device.

Other methods used to measure current emitted by field emitter devices employ a positively biased electrode. However, these methods also measure the total current emitted by substantially all of the pixels in the completed unit. Therefore, these methods are also limited to measuring the operation of the device as a whole.

There still exists a need for a method to measure the current emitted by individual pixels in the display in order to determine their functionality, as well as the total number of functioning pixels (also known as the "yield"). Additionally, manufacturing realities require that the functionality of the individual pixels is measured in a rapid fashion.

SUMMARY OF THE INVENTION

The functionality of individual pixels in an addressable emissive cathode is determined by measuring the emitted current from a single pixel or from a small group of pixels. The current is measured on an anode screen disposed above the cathode emitters, thereby enabling the anode to collect electrons emitted from the cathodes. The collected current is compared to known parameters in order to determine whether the individual pixel site is functional.

The method of the present invention allows for the testing of cathode emitters in a vacuum chamber through the use of probe cards or sockets, and an anode. This format allows for the testing of approximately 100,000 pixels in less than 30 seconds, thereby expanding testing capabilities. Not only does the present technique permit faster testing, but also a less expensive alternative to the functionality tests used for individual pixels.

One advantage of the test method of the present invention is that it enables rapid determination of individual pixel functionality of the cathode emitters used in field emission type displays, or other similarly addressed matrix displays. For example, the present test method is suitable for displays that are actively or passively addressed.

The method of the present invention permits testing of the cathode emitters either as a baseplate or an assembled display device. Additionally, the use of an anode which luminesces under electron bombardment permits the measurement of emitted photons to determine pixel functionality.

The present invention is employed to sequence through all of the pixels, one or more at a time. Additionally, there is no required spacing for the anode in order to achieve accurate measurement. Further the present invention can be used with current optical methods to enhance the value of those methods.

One embodiment of the present invention is a method of testing cathode emitters by measuring the current emitted from the emitters. A group of cathode emitters comprises a pixel.

Another embodiment of the present invention is a method for measuring functionality in an addressable matrix used in a display device by addressing a single pixel, thereby creating an output. The output of the single pixel is then measured to determine functionality of that particular pixel.

A further embodiment of the present invention is a method for determining functionality of cathode emitters in which at least one pixel is addressed, thereby producing a current. The pixel is comprised of at least one cathode emitter. Collecting the current using an anode which is disposed opposite said at least one pixel. Measuring the current, and comparing the current to an expected value.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
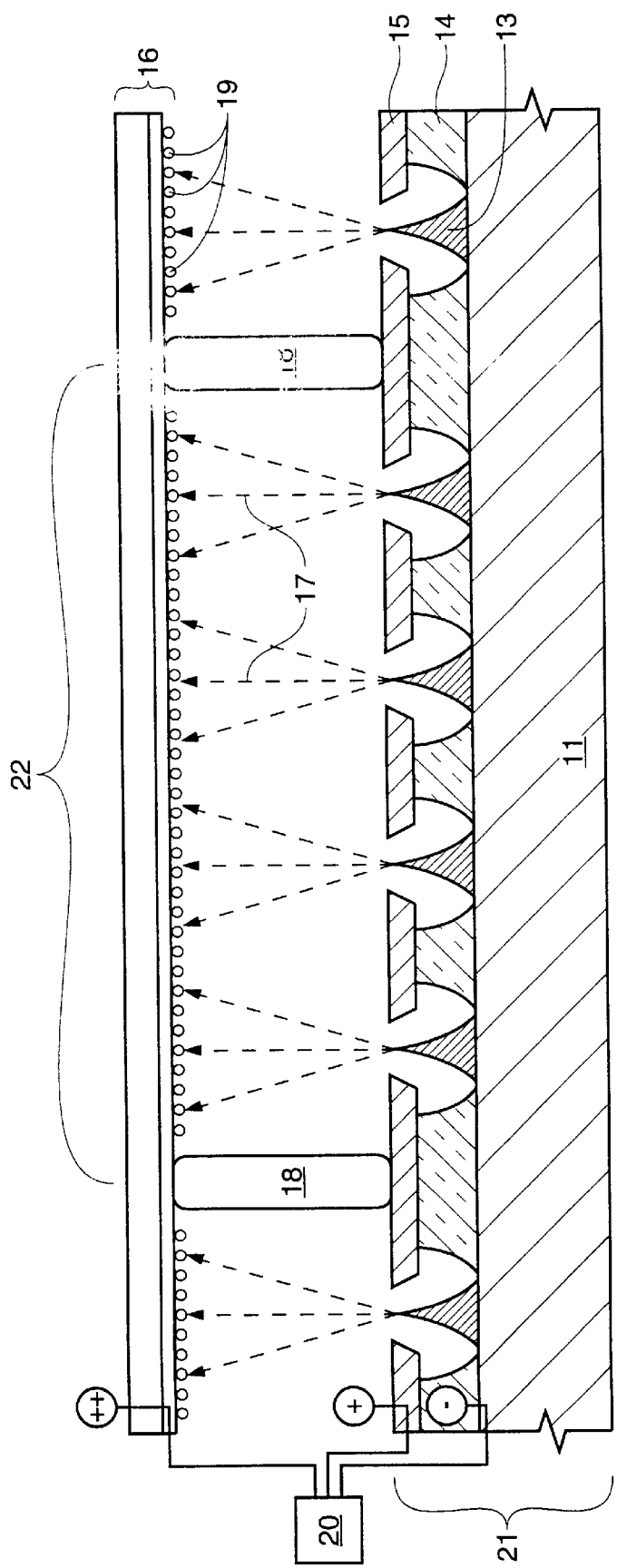
FIG. 1 is a schematic cross-section of a pixel of an illustrative field emission display having emitter tips.

Referring to FIG. 1, a representative field emission display employing a display segment 22 is depicted. Each display segment 22 is capable of displaying a pixel of information, or a portion of a pixel, as, for example, one green dot of a red/green/blue full-color triad pixel.

Preferably, a single crystal silicon layer serves as a substrate 11. Alternatively, amorphous silicon deposited on an underlying substrate comprised largely of glass or other combination may be used as long as a material capable of conducting electrical current is present on the surface of a substrate so that it can be patterned and etched to form micro-cathodes 13.

At a field emission site, a micro-cathode 13 has been constructed on top of the substrate 11. The micro-cathode 13 is a protuberance which may have a variety of shapes, such as pyramidal, conical, or other geometry which has a fine micro-point for the emission of electrons. Surrounding the micro-cathode 13, is a grid structure 15. When a voltage differential, through source 20, is applied between the cathode 13 and the grid 15, a stream of electrons 17 is emitted toward a phosphor coated screen 16. Screen 16 is an anode.

The electron emission tip 13 is integral with substrate 11, and serves as a cathode. Gate 15 serves as a grid structure for applying an electrical field potential to its respective cathode. 13.

A dielectric insulating layer 14 is deposited on the S conductive cathode 13, which cathode 13 can be formed from the substrate or from one. or more deposited conductive films, such as a chromium amorphous silicon bilayer. The insulator 14 also has an opening at the field emission site location.

Disposed between said faceplate 16 and said baseplate 21 are located spacer support structures 18 which function to support the atmospheric pressure which exists on the electrode faceplate 16 as a result of the vacuum which is created between the baseplate 21 and faceplate 16 for the proper functioning of the emitter tips 13.

The baseplate 21 of the invention comprises a matrix addressable array of cold cathode emission structures 13, the substrate 11 on which the emission structures 13 are created, the insulating layer 14, and the anode grid 15.

The process of the present invention provides a method for testing cathodes emitters, which cathodes are frequently used in field emitter display devices. The testing procedure of the present invention is discussed in terms of field emission displays. However, one having ordinary skill in the art, upon being apprised of the present invention would realize its applicability to other matrix addressable displays or devices having emissive cathodes.

The field emitter displays have cathode emission structures 13 which emit electrons into a vacuum environment. For purposes of display devices, the electrons are collected on an anode 16 which is coated with phosphors 19. The phosphors 19 luminesce under electron 17 bombardment, thereby creating the colored light which forms the displayed image.

Figure 2A:
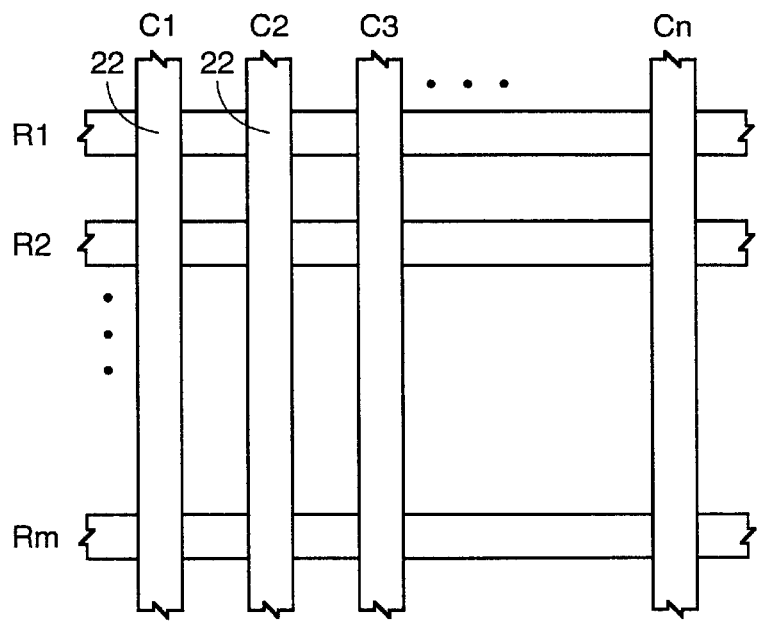
FIGS. 2A–C are schematic top-view of the field emission display illustrating the relative location of the pixels of FIG. 1, illustrating a testing sequence, according to the present invention.
Figure 2B:
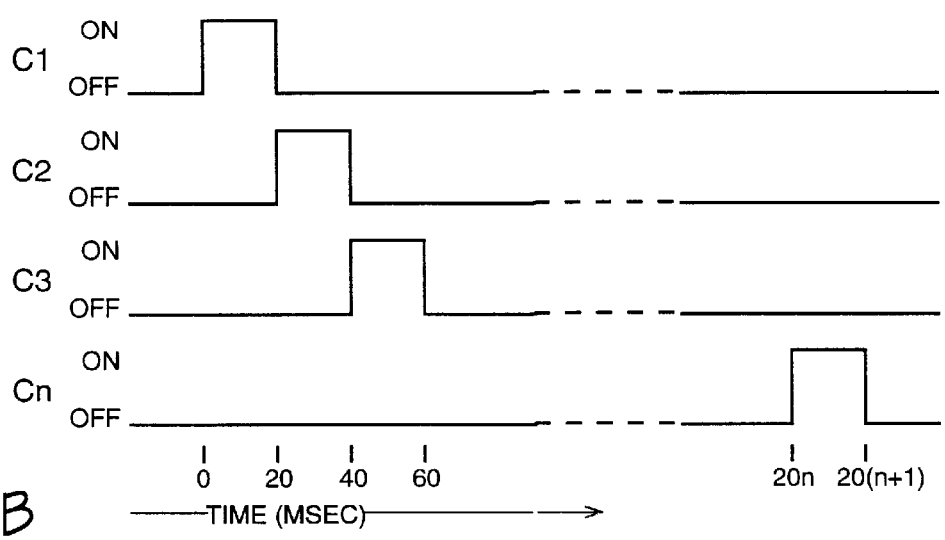
Figure 2C:
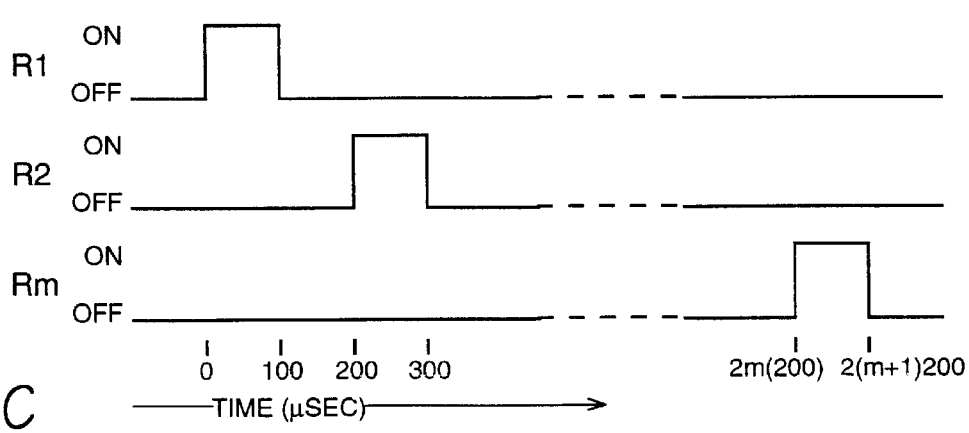

During the operation of the display, individual pixels 22 are turned on, so that the pixels 22 emit a controlled amount of current. Each pixel contains one or more cathode emitter structures 13. FIGS. 2A–C illustrate that the control of the pixels 22 is accomplished by a matrix addressable system of rows $R_1 \ldots R_m$ and columns $C_1 \ldots C_n$. Pixel sites 22 are disposed at the intersection of the rows and columns, and are thereby addressable by their location. In this manner, individual pixels 22 are addressable one or more at a time.

The test method of the present invention is performed by turning on all of the pixels of the cathode 12 for "burn in," and to establish an equilibrium. "Burn in" refers to stressing the devices through electrical cycling, thereby causing any defective parts to fail.

The drive cycle is started in which individual pixels are turned on one at a time or in small groups. This application will refer to the pattern of addressing the pixels 22 as "sequencing," and it is to be understood that the pixels 22 are addressable in a variety of patterns or in a row or column. Sequencing through the pixels 22 enables all of the pixels 22 to be addressed and tested for functionality.

The drive cycle is illustrated in FIGS. 2A–C. A column ($C_1$) is turned on, as well as a row ($R_1$), thereby causing the pixel 22 located at their intersection to emit electrons 17. The emitted electrons create a current which is collected on an anode plate 16 disposed above the cathode emitters 13. The anode 16 has a positive bias with respect to the cathodes 13, thereby enabling the anode 16 to collect the electrons 17.

For purposes of the test method of the present invention, the anode used may or may not be the screen 16, depending on whether the cathode emitters are being tested before or after complete assembly.

Figure 3:
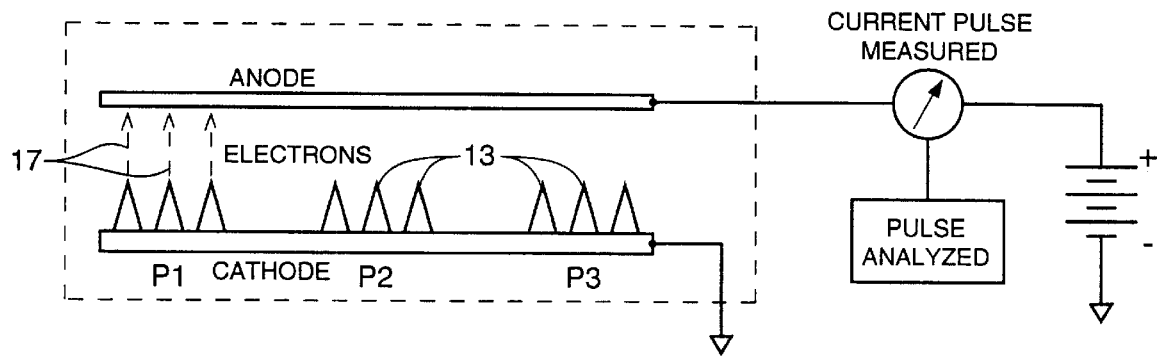
FIG. 3 is a schematic cross-section of the pixels of FIG. 2, illustrating an electrical method used to test the current of the pixels, according to the present invention.

The collected current is measured and compared with known data for good pulse current. See, for example, FIG. 3. The current magnitude is measured to determine whether the current is above or below the known value. Alternatively, the shape of the pulse (rise time, fall time, etc.) is measured to determine whether the pixel 22 responds properly in a given time frame.

The measurement techniques include coupling the current through a capacitor; measuring the voltage across a resistor; or directly measuring the current through a power source. The method chosen varies with the amount of anode voltage used, the size of the current pulse, and the speed with which the measurement is taken.

After the current from the first pixel is measured, a second pixel in the same or another column is addressed. The current from the second pixel is measured, and the process is repeated until all of the pixels have been measured.

A delay time between each measurement is incorporated to allow for data processing, and for decay of the pulse when the time response of the system is slow. For example, pixel ($P_1$) is turned on for 100 µsec. After which no pixel is turned on for 100 µsec. Then pixel ($P_2$) is turned on for 100 µsec, and so on. Using this 200 µsec. total time (i.e., pulse plus delay time), the system is capable of measuring approximately 100,000 pixels in about 20 seconds. This is especially useful in displays having more than 10,000 pixels.

Of course, depending on the size of the baseplate 21 and the number of pixels thereon, the timing of the individual pixel test may vary. The preferable range for pulse plus delay is approximately 10 µsec to 10 msec.

This is quite a significant advancement over the visual inspection methods currently used, as the present method enables the electrical testing of substantially every pixel 22 individually, and in a rapid fashion.

Non-functional pixels appear as black spots in the display. It only takes a small number of non-functional pixels to cause a display to be non-marketable. Hence, it is worthwhile to know whether the baseplate 21 has defective pixels before completing the assembly of the display device.

The amount of time required for the test varies with the amount of time needed to measure the pulse, the time needed for the pulse to reach equilibrium and decay, and the time needed to process the data. However, the test method of the present invention is independent of address method (e.g., passive or active circuitry) or current regulation schemes.

In an alternative embodiment, multiple pixels are turned on at the same time. For example, one desires to test a group of five pixels. In such a case, four of the pixels are turned on at the same time (e.g., $P_1$, $P_2$, $P_3$, $P_4$), and one pixel ($P_5$) remains off, and the current emitted is measured. Then, a different subset of the same five pixels is turned on (e.g., $P_1$, $P_2$, $P_3$, $P_5$), and a different one of the pixels remains off ($P_4$), and the current is measured. Preferably, the number of pixels 22 tested at one time is less than 10.

The current emitted from the first subset is then compared with that of the second subset, or with the current from a subset known to contain working pixels. Then as different combinations of pixel groups are turned on, the functionality of those pixels is determined from the expected value.

This approach is especially useful in those situations where the current emitted from one pixel 22 is so small that accurate measurement is difficult due to background noise in the system. In this embodiment, the total current measured is larger because several pixels are tested at once.

Additionally, using the above-described approach, it is possible to measure the total current emitted from a group of pixels. So, a bulk value is obtained for a specified number of pixels. The total value is compared to a known or expected value. The measurement determines whether a particular group of pixels is non-functional. This is useful when the there is a low current emitted per pixel 22, but it does not involve the sorting of the combination measurement as in the above described approach.

The measurement techniques of the present invention are suitable for both fully assembled display devices, and for baseplates 21 which are disposed in a vacuum environment with a separate anode or an integrated anode 16.

Figure 4:
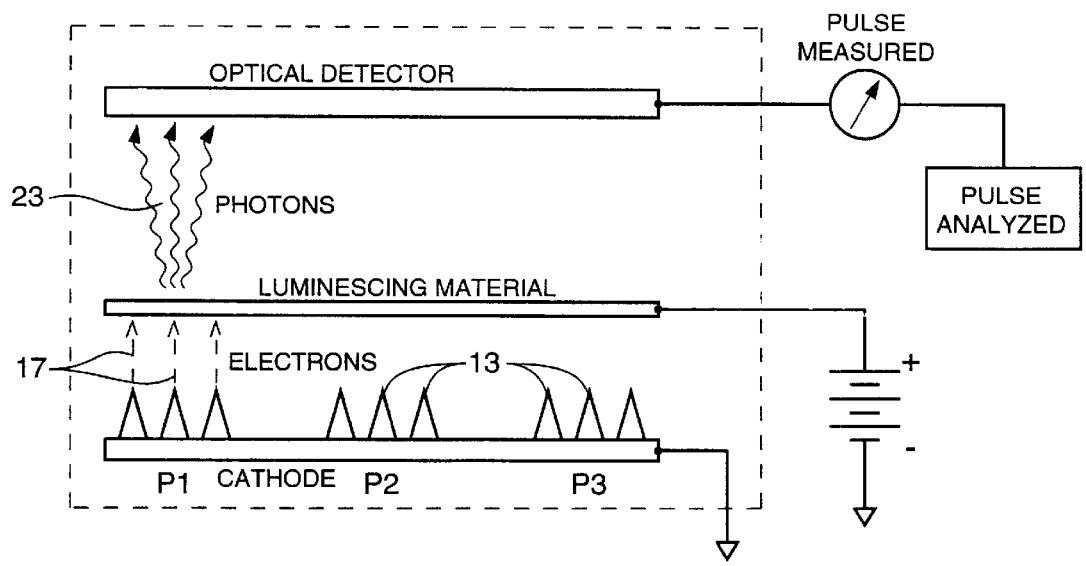
FIG. 4 is a schematic cross-section of the pixels of FIG. 2, illustrating an optical method used to test the photons emitted by the pixels, according to the present invention.

The testing scheme of the present invention is repeatable with optical, as opposed to electrical measurements. The anode 16 is coated with a material, preferably a phosphor 19, that luminesces under electron bombardment 17. An optical detector, such as a photodiode, is disposed over the anode 16. When the electrons from a pixel 22 or group of pixels cause the anode 16 to luminesce, the photons 23 are measured by the detector, and the information is recorded, as illustrated in FIG. 4.

As with the electrical measurements previously described, the magnitude, shape, rise time, and duration of the pulse are parameters which can be compared to those of a known good pulse, thereby allowing the pixel functionality to be determined. As with the other methods, this embodiment is useful in assembled displays, or with cathode emitters disposed in a vacuum. However, a difference in the timing sequence is present, as it would depend on the decay time of the luminescing material, as well as the frequency response time of the detector used.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, one having ordinary skill in the art will realize that the current from the cathode can also be measured to determine the functionality of the pixels. In such an embodiment, the current from the power supply to the pixel or baseplate is measured, and compared to a known value.

What is claimed is:

1. A method for testing at least a portion of a field emission display, comprising:
   providing a screen anode, the screen anode at least partially disposed within a display segment of the field emission display;
   providing a pixel;
   generating a potential difference between the screen anode and the pixel;
   emitting electrons from the pixel in at least partial response to the potential difference;
   at the screen anode, collecting at least a substantial portion of the electrons emitted;
   providing the electrons collected as a current pulse;
   measuring the current pulse; and
   comparing the measured value to a known value to determine functionality of the pixels.

2. A method, as in claim 1, further comprising:
   providing an array address; and
   accessing the pixel with the array address.

3. A method, as in claim 1, further comprising:
   determining a magnitude of the current pulse measured; and
   comparing the magnitude with a test parameter magnitude.

4. A method, as in claim 1, further comprising:
   determining a rise time of the current pulse measured; and
   comparing the rise time with a test parameter rise time.

5. A method, as in claim 1, further comprising:
   determining a fall time of the current pulse measured;
   comparing the fall time with a test parameter fall time.

6. A method, as in claim 1, wherein the screen anode is completely within a display segment of the field emission display.

7. A method for testing field emission for a field emission display, comprising:
   providing pixels, each of the pixels having a plurality of cathode emitters;
   providing a screen anode, the screen anode at least partially disposed within a display segment;
   selecting a first portion of the pixels;
   applying a voltage to the screen anode and the first portion;
   generating a first emission from the first portion at least in partial response to the voltage applied;
   at the screen anode, collecting electrons of the first emission to provide a first current pulse;
   measuring the first current pulse; and
   comparing the measured value to a known value to determine functionality of the first portion of the pixels.

8. A method, as in claim 7, further comprising checking the first current pulse against a test parameter.

9. A method, as in claim 7, further comprising:
   selecting a second portion of the pixels;
   applying the voltage to the screen anode and the second portion;
   generating a second emission from the second portion at least in partial response to the voltage applied;
   at the screen anode, collecting electrons of the second emission to provide a second current pulse; and measuring the electrons collected from the second emission.

10. A method, as in claim 9, further comprising comparing the first current pulse to the second current pulse.

11. A method, as in claim 9, further comprising comparing the first current pulse and the second current pulse to a test parameter.

12. A method for testing at least a portion of a field emission display, comprising:
   providing pixels, each of the pixels having a plurality of cathode emitters;
   providing a screen anode, the screen anode at least partially disposed within a display segment;
   accessing a subset of the pixels, the subset including more than one of the pixels;
   selecting a first pixel and a second pixel of the subset;
   applying voltage to all but the first pixel of the subset to emit electrons from a first remainder of the pixels;
   applying voltage to all but the second pixel of the subset to emit electrons from a second remainder of the pixels;
   at the screen anode, respectively collecting electrons emitted from the first remainder and the second remainder; and
   measuring the electrons collected as respective current pulses.

13. A method, as in claim 12, further comprising the step of comparing each of the current pulses to an expected value therefor.

14. A method, as in claim 12, further comprising the step of comparing each of the current pulses to one another.

15. A method for testing field emission of a field emission display, comprising:
   providing a first anode, the first anode at least partially disposed within a display segment;
   providing a second anode, the second anode at least partially disposed within the display segment;
   providing pixels, each of the pixels having a plurality of cathode emitters;
   selecting a first portion of the pixels;
   applying a bias voltage to the first portion to provide a first electron emission;
   collecting at least a portion of the first electron emission at the first anode;
   providing a first photon emission to the second anode in response to the collection of the first electron emission; and
   measuring the first photon emission as a first pulse, the first pulse indicative of the field emission of the first portion of pixels.

16. A method, as in claim 15, further comprising the steps of:
   selecting a second portion of the pixels different from the first portion;
   applying the bias voltage to the second portion to provide a second electron emission;
   collecting at least a portion of the second electron emission at the first anode;
   providing a second photon emission to the second anode in response to the collection of the second electron emission; and
   measuring the second photon emission as a second pulse, the second pulse indicative of the field emission of the second portion of pixels.

17. A method, as in claim 15, further comprising the step of:
   comparing the first pulse and the second pulse to a know value therefor.

18. A method, as in claim 15, wherein the first anode and the second anode are completely disposed within the display segment.

19. A method, as in claim 15, wherein the first anode is a luminescent material.

20. A method, as in claim 19, wherein the second anode is an optical detector.

21. A method of testing at least a portion of a field emission display, comprising:
   applying a potential difference to a pixel of the display for a determined period of time to cause an emission of electrons in the pixel;
   measuring a current pulse created by the emission of electrons;
   comparing at least one parameter of the measured current pulse to at least one parameter of a known current pulse to determine the functionality of the pixel; and
   repeating the method on another pixel of the display after a predetermined time delay, wherein the predetermined period of time for applying the potential difference is about 100 $\mu$sec.

22. A method of testing at least a portion of a field emission display, comprising:
   applying a potential difference to a pixeel of the display for a predetermined period of time to cause an emission of electrons in the pixel;
   measuring a current pulse created by the emission of electrons;
   comparing at least one parameter of the measured current pulse to at least one parameter of a known current pulse to determine the functionality of the pixel; and
   repeating the method on another pixel of the display after a predetermined time delay, wherein the predetermined time delay is about 100 $\mu$sec.

23. A method of testing at least a portion of a field emission display, comprising:
   applying a potential difference to a pixel of the display for a predetermined period of time to cause an emission of electrons in the pixel;
   measuring a current pulse created by the emission of electrons;
   comparing at least one parameter of the measured current pulse to at least one parameter of a known current pulse to determine the functionality of the pixel; and
   repeating the method on another pixel of the display after a predetermined time delay, wherein the predetermined period of time for applying the potential difference combined with the predetermined time delay is about 10 $\mu$sec to about 10 msec.

24. A method for testing at least a portion of a field emission display, comprising:
   applying a potential difference to a first set of pixel of the display to cause an emission of electrons in the first set of pixels;
   measuring a first current value resulting from the emission of electrons in the first set of pixels;
   applying the potential difference to a second set of pixels of the display to cause an emission of electrons in the second set of pixels;
   measuring a second current value resulting from the emission of electrons in the second set of pixels; and comparing the first current value and the second current value to at least one of each other and a known value.

25. The method of claim 24, wherein the first set of pixels and the second set of pixels each contain less than about ten pixels.

26. The method of claim 25, further comprising repeating the method for all sets of pixels of the display.

27. The method of claim 25, wherein the first set of pixels and the second set of pixels contain a selected combination of pixels in common.

28. A method for testing at least a portion of a field emission display, comprising:

applying a potential difference to a first set of pixels of the display to cause an emission of photons from the first set of pixels;

measuring at least one parameter characteristic of the emission of photons from the first set of pixels;

applying the potential difference to a second set of pixels of the display to cause an emission of photons from the second set of pixels;

measuring at least one parameter characteristic of the emission of photons from the second set of pixels; and comparing the at least one parameter from the first set of pixels and the at least one parameter from the second set of pixels, to at least one of, each other and a known value.

* * * * *